United States Patent [19]
Cullinan et al.

[11] Patent Number: 5,719,748
[45] Date of Patent: Feb. 17, 1998

[54] SEMICONDUCTOR PACKAGE WITH A BRIDGE FOR CHIP AREA CONNECTION

[75] Inventors: Deborah A. Cullinan, Plymouth; Thomas J. Dunaway, New Hope; Richard K. Spielberger, Maple Grove, all of Minn.

[73] Assignee: Honeywell Inc., Minneapolis, Minn.

[21] Appl. No.: 495,138

[22] Filed: Jun. 28, 1995

[51] Int. Cl.⁶ .................. H05K 1/11; H01R 9/09
[52] U.S. Cl. .............. 361/764; 361/761; 361/763; 361/782; 361/775
[58] Field of Search .................. 174/68.2, 250, 174/253, 254, 255, 256, 258, 260, 261, 268; 257/700, 690, 691, 692, 723, 724, 786, 758, 684; 361/761, 763, 764, 767, 768–770, 771, 772, 774, 775, 776, 777, 778, 780, 783, 790, 784, 749, 748, 792–795, 803, 782; 439/47, 48, 67, 69, 74, 77

[56] References Cited

U.S. PATENT DOCUMENTS

| | | | |
|---|---|---|---|
| 4,705,917 | 11/1987 | Gates, Jr. et al. | 174/52.4 |
| 4,801,999 | 1/1989 | Hayward et al. | 257/691 |
| 4,802,062 | 1/1989 | Blum et al. | 361/775 |
| 5,006,963 | 4/1991 | Spangler et al. | 174/52.4 |
| 5,119,169 | 6/1992 | Kozono et al. | 257/691 |
| 5,138,436 | 8/1992 | Koepf | 257/700 |
| 5,198,963 | 3/1993 | Gupta et al. | 361/761 |
| 5,311,058 | 5/1994 | Smolley | 257/691 |

FOREIGN PATENT DOCUMENTS

| | | | |
|---|---|---|---|
| 57-32661 | 2/1982 | Japan | 257/690 |
| 59-54248 | 3/1984 | Japan | 257/697 |

*Primary Examiner*—Donald Sparks
*Attorney, Agent, or Firm*—Gregory A. Bruns

[57] ABSTRACT

A semiconductor package including a base having a chip receiving portion and a surrounding portion; a bridge having conductive strips extending over the chip and supported at the surrounding portion; wires connect the conductive strips to power and ground; and wires connect the conductive strips to chip area power and ground bonding pads. Decoupling capacitors may be mounted on the base.

10 Claims, 4 Drawing Sheets

SEMICONDUCTOR PACKAGE WITH A BRIDGE FOR CHIP AREA CONNECTION

BACKGROUND OF THE INVENTION

The present invention relates to the packaging of integrated circuits (ICs), and more particularly to the problems associated with the extremely high number of connections that must be made to an IC chip or die.

An IC chip is typically housed within a package for protecting and making electrical connections to the chip.

IC chips typically include bonding pads which enable external electrical connection of circuits contained in the chip. The bonding pads are usually located at the perimeter of the chip. The trend of semiconductors is toward high levels of integration with requirements for an increasing number of signal inputs and outputs. Integrated circuit packages having, for example 256 leads or 284 leads are common. A gate array ASIC, for example, may require in excess of 400 connections. In addition, to obtain the desired performance, there are requirements for multiple sets of power-ground connections to the chip and the connection of capacitors across the power-ground connections. The economics of die leverage considerations do not allow for the chips to be made significantly larger to increase the space available for chip connections. It is increasingly difficult to meet these requirements when the placement of chip connections, i.e., bonding pads, is limited to the perimeter of an IC chip.

Thus a need exists for a packaging arrangement that increases the area available for chip connections.

SUMMARY OF THE INVENTION

The present invention solves these and other needs by providing a semiconductor package for chip area connection. A package base has a central recessed portion and a surrounding, or perimeter, portion. The central recessed portion is for receiving a semiconductor die. A bridge extends over the semiconductor die and is supported at the perimeter, or surrounding portion. In a preferred form, the bridge is formed with a first member parallel to the length dimension of the chip and a second member parallel to the width dimension of the chip, with the first member and the second member in a cross arrangement. The bridge includes a power bus and a ground bus. The power and ground bus are connected to power and ground connections at the base. The semiconductor die has power and ground bond pads located adjacent to the bridge which are connected to the power and ground busses by wire bonds. The bridge is formed of an insulative material and has ends shaped for complementary receipt on the perimeter of the base. Decoupling capacitators may be mounted on the base.

DETAILED DESCRIPTION OF THE INVENTION

Figure 2:
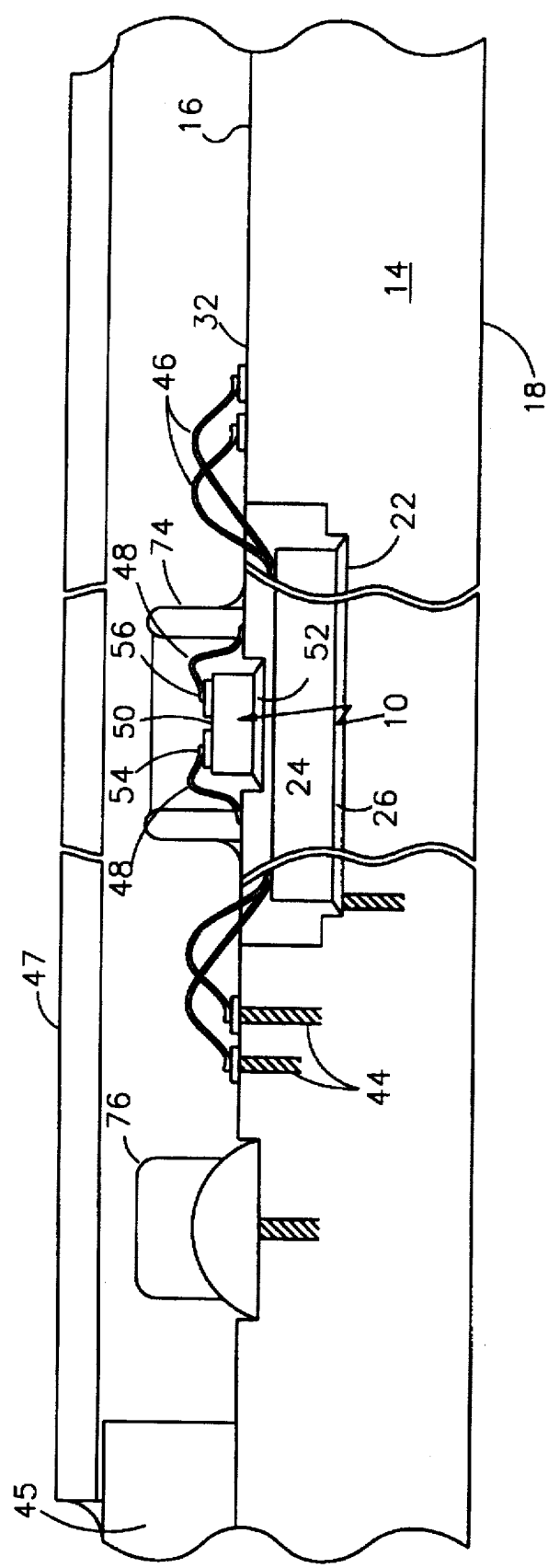
FIG. 2 is a cross-sectional view of the integrated circuit package of FIG. 1.

An integrated circuit package bridge or insert for chip area wirebond is shown in the figures and generally designated 10. A semiconductor chip package 12 includes a base 14, upper surface 16 and lower surface 18. Base 14 has a central recessed portion or cavity 20 having a surface 22 for receiving IC chip or die 24. Die 24 is secured to surface 22 by, for example, solder 26. Upper surface 16 includes an outer or perimeter surface portion 32. Chip 24 has a length dimension, l, a width dimension, w, and includes perimeter bond pads 34 and area bond pads 36 and 38. Base 14 includes bond pads on perimeter surface 32 which are internally connected to conductors 44 within base 14 which typically are connected to a lead frame (not shown). Seal ring 45 and lid 47 are shown in FIG. 2. The lead frame would normally extend outside of base 14 for connection to a printed circuit board or other connection means Insert 10 may be of ceramic or other insulative material. Insert 10 includes upper surface 50 and lower surface 52. Insert 10 also includes conductive strips, for example strip 54 and strip 56 which are located on surface 50. In one embodiment insert 10 is formed in an integral cross arrangement of member 58, located parallel to length, l, and member 60 located parallel to width, w.

Member 58 includes end 62 and end 64 while member 60 includes end 66 and end 68. Ends 62, 64, 66, and 68 rest on perimeter 32 to support insert 10 with the ends and the perimeter shaped or notched for complimentary receipt of the ends on the perimeter.

Figure 1:
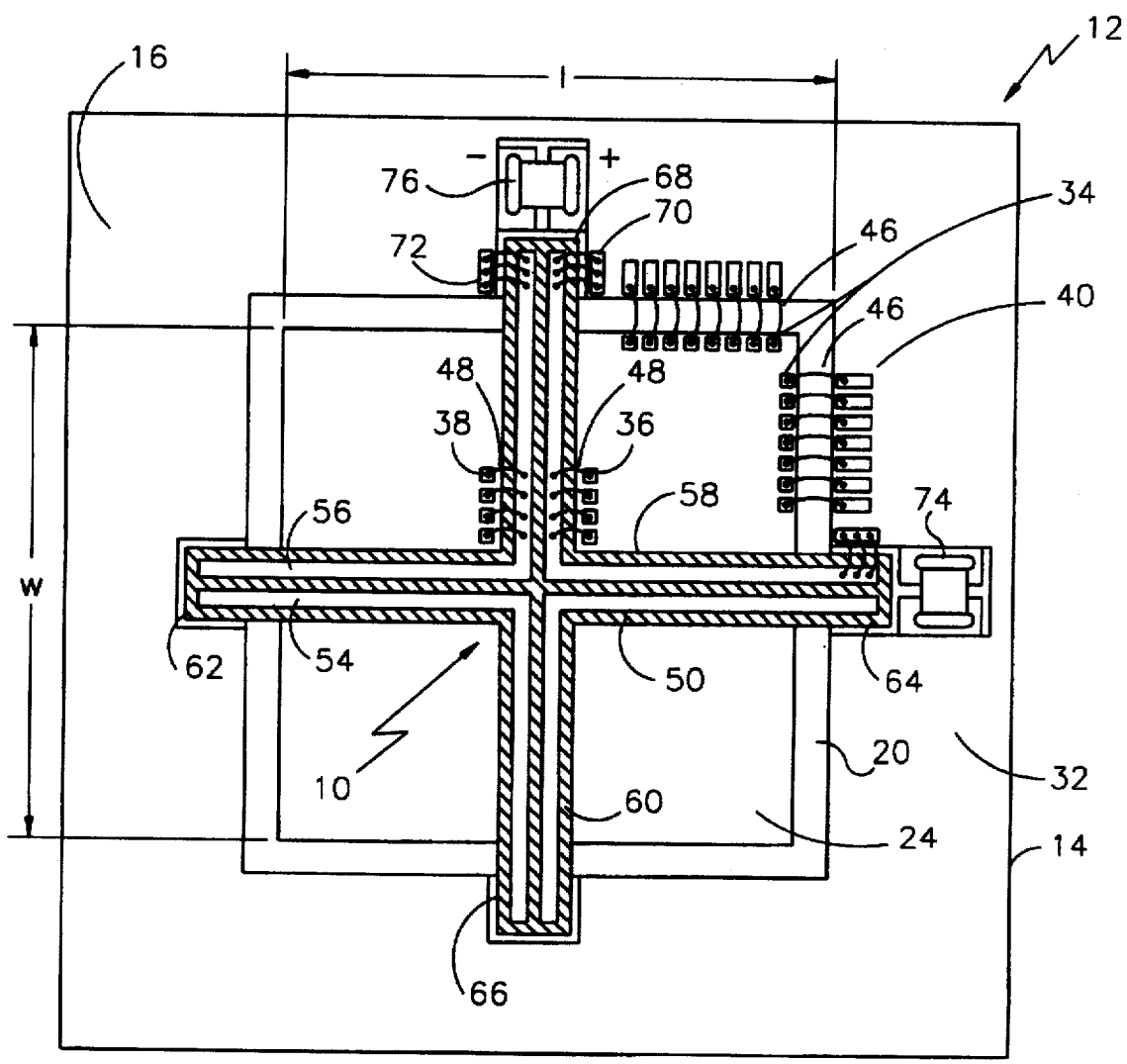
FIG. 1 is a plan view of an integrated circuit package insert in accordance with the principles of the present invention.

In the configuration shown in FIGS. 1 and 2, power and ground are supplied to bridge 10 at power pad 70 and ground pad 72. Also shown in the figures are decoupling capacitors 74 and 76 which are connected across power and ground terminals.

Insert 10 may be made from materials compatible with the materials of package 12. For example, if base 14 is made, for example co-fired, using multilayer ceramic technology, then insert 10 may be made of ceramic material, and conductive strips may be tungsten-nickel-gold (TiNiAu).

Insert 10 may be attached to base 14 by a variety of means. For example epoxy or solder may be used. In one example, bridge 10 may be secured simultaneously with the die bond operation if an equilibrium solder reflow process is used. When a scrub type die attach process is used, insert 10 may be attached directly after this die attach process.

While insert 10 has been described for use with a single-chip package, it may also be used for multi-chip packages or multi-chip modules (MCM's).

Figure 3:
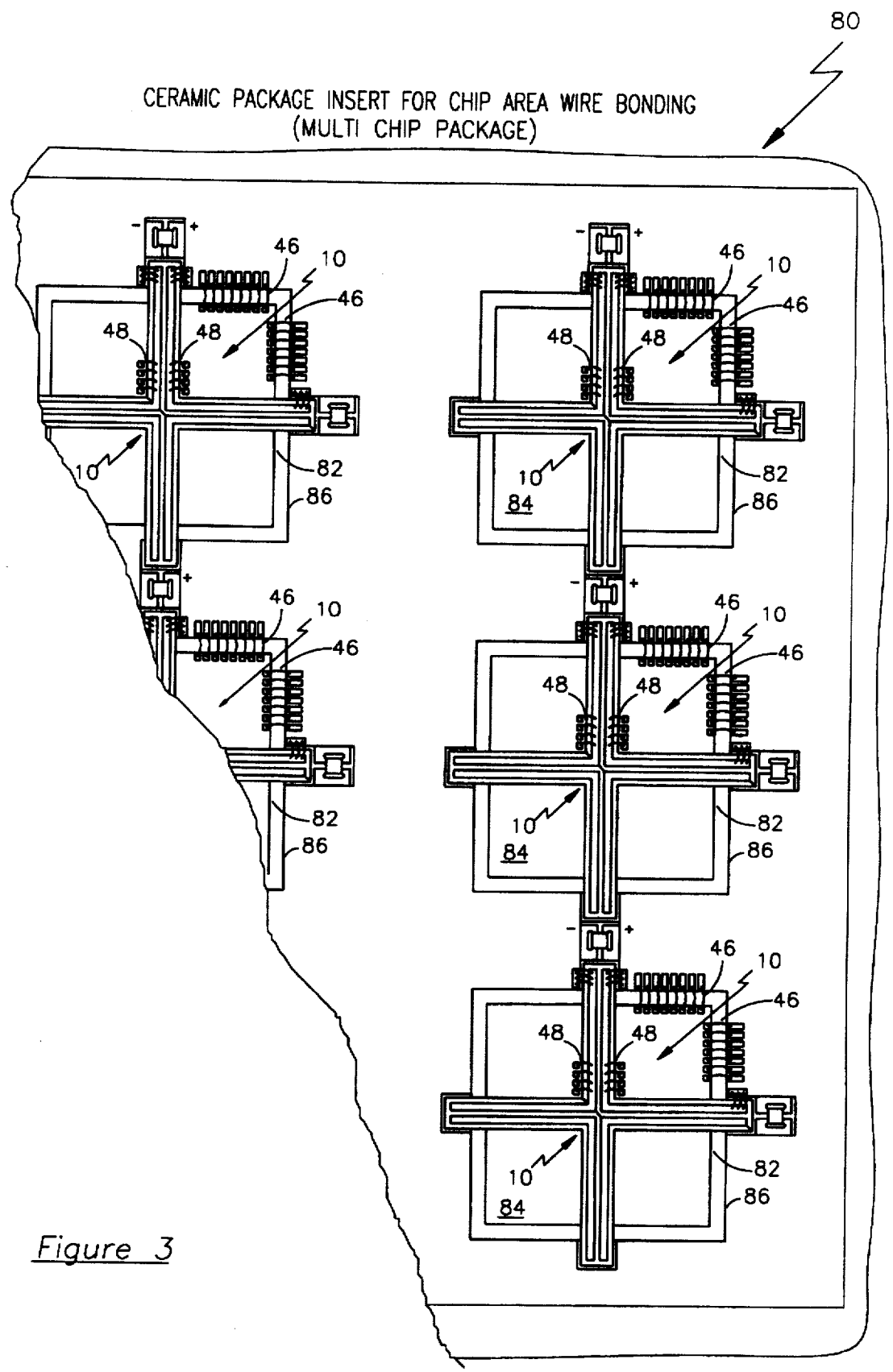
FIG. 3 is a plan view of an integrated circuit package insert used in a multi-chip package.
Figure 4:
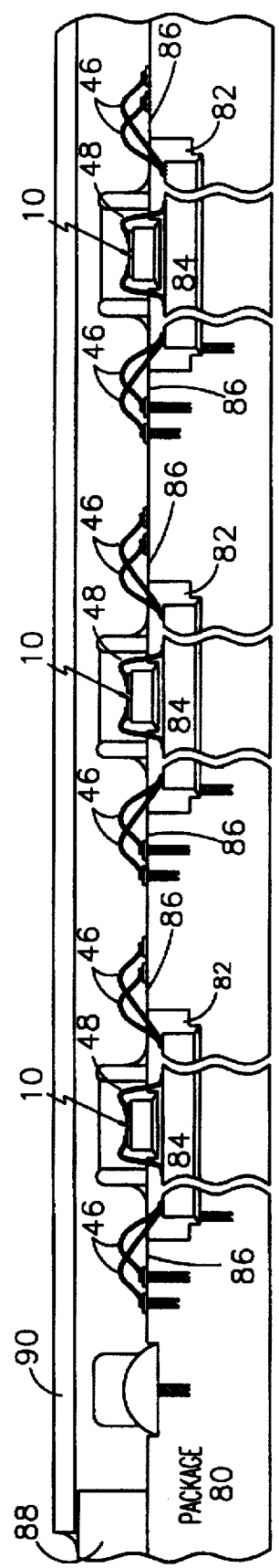
FIG. 4 is a cross-sectional view of a portion of the integrated circuit package of FIG. 3.

FIG. 3 shows a portion of a multi-chip package 80 having a number of recesses 82 for receiving chips 84. Recesses 82 are surrounded by portions 86. FIG. 4 is a cross-section of the package of FIG. 3 showing a seal ring 88 and a lid 90.

The scope of the invention is not to be limited by the foregoing description, but by the appended claims.

We claim:

1. In a semiconductor package of the type having a base having a recessed central portion for receiving a chip and a perimeter portion having electrical connection means which are connected through said base to outer connection means, the improvement comprising:

a bridge extending over said semiconductor chip and supported at said perimeter portion, said bridge having a plurality of conductive strips thereon, said strips facing away from said chip;

a first one of said plurality of conductive strips connected to a first reference voltage at said base;

said chip having a plurality of bonding pads which enable external connection of circuits contained in said chip, said bonding pads located adjacent said bridge; and means for selectively connecting said plurality of conductive strips to said bonding pads.

2. Semiconductor package of claim 1 wherein said semiconductor chip has a length dimension and a width dimension and said bridge is formed with a first member parallel to said length dimension and a second member parallel to said width dimension with said first member and said second member in a cross arrangement.

3. Semiconductor package of claim 2 wherein said means for selectively connecting is wire bond.

4. Semiconductor package of claim 3 wherein said bridge comprises a ceramic material and said perimeter portion is shaped for complimentary receipt of said bridge.

5. Semiconductor package of claim 3 wherein said means for connecting a first one of said plurality of conductive strips to a first reference voltage and said means for connecting a second one of said plurality of conductive strips to a second reference voltage comprises wire bond means.

6. Semiconductor package of claim 5 wherein said means for selectively connecting is wire bond.

7. Semiconductor package of claim 5, further comprising means for mounting at least one decoupling capacitor at said surrounding portion.

8. A semiconductor package for making electrical connections to a semiconductor die, comprising:

a base having a perimeter portion and a central portion, said central portion recessed for receiving a semiconductor die;

said die having a first edge and a second edge perpendicular to said first edge;

a bridge extending over said semiconductor die, said bridge formed of insulative material and having a first member and a second member, with said first member and said second member forming a cross having ends, with said ends supported at said perimeter;

first and second conductive strips formed on said bridge, said first conductive strip connected to a first reference voltage and said second conductive strip connected to a second reference voltage;

said die having a plurality of bonding pads which enable external connection of circuits contained in said chip, said bonding pads located adjacent said bridge; and means for selectively connecting said plurality of conductive strips to said bonding pads.

9. Semiconductor package of claim 8 wherein said bridge comprises a ceramic material and said perimeter portion is shaped for complimentary receipt of said bridge.

10. Semiconductor package of claim 8, further comprising means for mounting at least one decoupling capacitor at said surrounding portion.

* * * * *